United States Patent
Ryan

(10) Patent No.: US 7,157,365 B2
(45) Date of Patent: Jan. 2, 2007

(54) SEMICONDUCTOR DEVICE HAVING A DUMMY CONDUCTIVE VIA AND A METHOD OF MANUFACTURE THEREFOR

(75) Inventor: Vivian Ryan, Hampton, NJ (US)

(73) Assignee: Agere Systems Inc., Allentown, PA (US)

( * ) Notice: Subject to any disclaimer, the term of this patent is extended or adjusted under 35 U.S.C. 154(b) by 81 days.

(21) Appl. No.: 10/842,139

(22) Filed: May 10, 2004

(65) Prior Publication Data

US 2005/0248033 A1   Nov. 10, 2005

(51) Int. Cl.
*H01L 21/4763* (2006.01)

(52) U.S. Cl. ...................... 438/622; 438/637

(58) Field of Classification Search .......... 438/620, 438/622, 629, 637, 638, 652; 257/774, 758
See application file for complete search history.

(56) References Cited

U.S. PATENT DOCUMENTS 5,755,903 A *  5/1998  Garant et al. ............ 156/89.21
6,232,662 B1 *  5/2001  Saran .......................... 257/750
6,346,475 B1 *  2/2002  Suzuki et al. ............... 438/637
6,468,894 B1 * 10/2002  Yang et al. .................. 438/622
6,492,259 B1 * 12/2002  Dirahoui et al. ............. 438/622
6,573,538 B1 *  6/2003  Motsiff et al. ............... 257/127
6,624,063 B1 *  9/2003  Hasegawa et al. .......... 438/623
6,984,579 B1 *  1/2006  Nguyen et al. ............. 438/622

FOREIGN PATENT DOCUMENTS

JP          11154679 A  *  6/1999

* cited by examiner

*Primary Examiner*—Hoai Pham
*Assistant Examiner*—Mursalin B. Hafiz

(57) ABSTRACT

The present invention provides a semiconductor device, a method of manufacture therefor, and an integrated circuit including the same. In one aspect, the present invention provides a semiconductor device having a dielectric layer located over a conductive feature and a conductive via located within the dielectric layer and contacting the conductive feature. The semiconductor device, among other elements, may further include a dummy conductive via located proximate the conductive via and contacting the conductive feature. One of the intents of the dummy conductive via is to attempt to trap vacancies associated with the conductive feature or the conductive via.

9 Claims, 9 Drawing Sheets

SEMICONDUCTOR DEVICE HAVING A DUMMY CONDUCTIVE VIA AND A METHOD OF MANUFACTURE THEREFOR

TECHNICAL FIELD OF THE INVENTION

The present invention is directed, in general, to a semiconductor device and, more specifically, to a semiconductor device having a dummy conductive via, a method of manufacture therefor and an integrated circuit including the same.

BACKGROUND OF THE INVENTION

Integrated circuits in general, and CMOS devices in particular, continue to gain wide spread use as the demands for increased functionality and enhanced benefits continue to enlarge. In order to meet these demands, the integrated circuit industry continues to develop new circuit structures that enhance capabilities and extend the use of existing fabrication processes and equipment.

Key to the fabrication of integrated circuits is the ability to construct highly reliable and low resistance connections between the individual semiconductor device terminals themselves, and other needed circuit components including various power supplying and common signal carrying conductor structures (buses) The industry often refers to connections made directly to a semiconductor device terminal as a contact (or windows) and connections made between other conductor structures as vias.

One issue that has recently started to plague the industry as the conductive structures have become more exotic and reduced in size, is that of stress migration. It is believed that stress migration grows by coalescence of vacancies, driven by a mechanical stress gradient, and appropriate temperatures. Eventually, over a period of time that is hard to predict, the stress migrations often result in open circuits. Whether the integrated circuits are copper, aluminum, or tungsten based, stress migration is a real issue.

Accordingly, what is needed in the art are interconnect structures that do not experience the stress migration issues experienced by the prior art interconnect structures.

SUMMARY OF THE INVENTION

To address the above-discussed deficiencies of the prior art, the present invention provides a semiconductor device, a method of manufacture therefor, and an integrated circuit including the same. In one aspect, the present invention provides a semiconductor device having a dielectric layer located over a conductive feature and a conductive via located within the dielectric layer and contacting the conductive feature. The semiconductor device, among other elements, may further include a dummy conductive via located proximate the conductive via and contacting the conductive feature.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
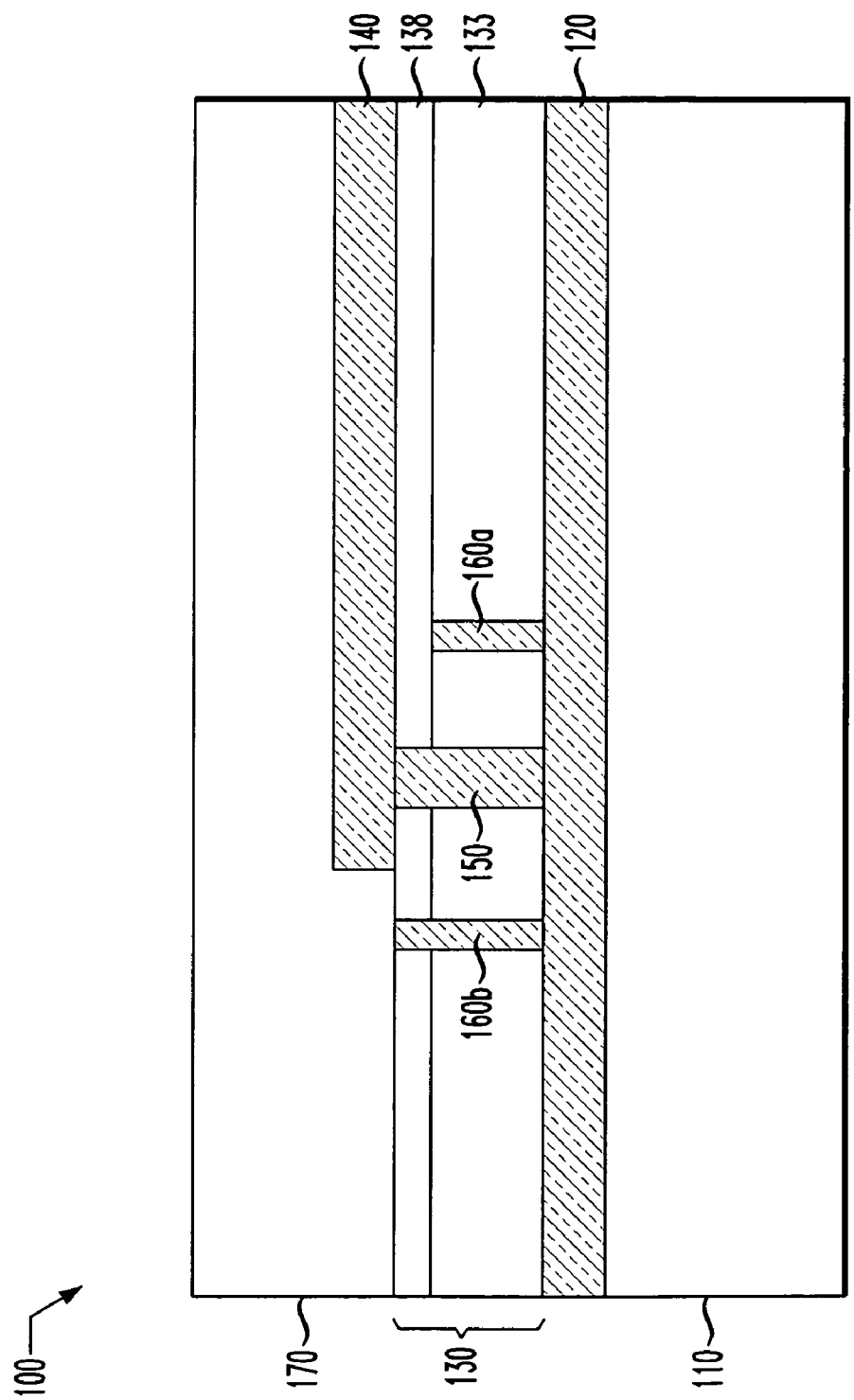
FIG. 1 illustrates a cross-sectional view of a semiconductor device manufactured in accordance with the principles of the present invention.

Referring initially to FIG. 1 illustrated is a cross-sectional view of a semiconductor device 100 manufactured in accordance with the principles of the present invention. The semiconductor device 100 illustrated in FIG. 1 includes a substrate 110 having a first conductive feature 120 located thereover. The first conductive feature 120, among others, may comprise a conductive stripe, otherwise known as a conductive runner. More specifically, the first conductive feature 120 could comprise at least a portion of a first metal level. As those skilled in the art are aware, stripes and runners are used to carry electrical current to different features on a single metal level. In contrast, vias are used to carry electrical current between metal levels.

The first conductive feature 120 may comprise a variety of different materials. For example, the first conductive feature 120 most notably may comprise copper, however, the first conductive feature 120 may just as easily comprise aluminum, tungsten, silver or another related material.

Nonetheless, for ease of discussion purposes, and for that reason only, the electrically conductive features of the present invention will generally be discussed with respect to copper from this point forward.

Positioned over the first conductive feature 120 is a first dielectric layer 130. The first dielectric layer 130, which may comprise one or more different layers, is often any one of the interlevel dielectric layers currently used in integrated circuits. In the particular embodiment shown and discussed with respect to FIG. 1, the first dielectric layer 130 comprises a first portion 133 and a second portion 138. While the materials for the first and second portions 133, 138, might be similar, their thicknesses might not. As the first and second portions 133, 138, are employed for manufacturing reasons, more details will be given below when discussing the manufacture of a semiconductor device similar to the semiconductor device 100 illustrated in FIG. 1.

Positioned over the first dielectric layer 130 is a second conductive feature 140. Similar to the first conductive feature 120, the second conductive feature 140 may comprise copper, aluminum, silver, tungsten or another similar material. Also, similar to the first conductive feature 120, the second conductive feature 140 may comprise a conductive stripe or runner. More specifically, the second conductive feature 140 could comprise at least a portion of a second metal level.

The semiconductor device 100 illustrated in FIG. 1 further includes a conductive via 150 located within the first dielectric layer 130 and contacting the first conductive feature 120. The conductive via 150, which in this embodiment comprises copper, electrically connects the first conductive feature 120 with the second conductive feature 140. Therefore, in this instance, the conductive via 150 is being used to interconnect the first metal level and the second metal level.

Uniquely located within the first dielectric layer 130 proximate the conductive via 150 are one or more dummy conductive vias 160a, 160b. The dummy conductive vias 160a, 160b physically contact the first conductive feature 120, and are configured to trap vacancies associated with the first conductive feature 120 or conductive via 150. Similar to the conductive via 150, the dummy conductive vias 160a, 160b may comprise copper, aluminum, silver, tungsten or another similar material.

Let it be known that the present invention is not just limited to the two dummy conductive via embodiment discussed with respect to FIG. 1. Actually, the number, placement and size of the dummy conductive vias are directly related to each other, as well as the amount of vacancies that the manufacturer wishes to tie up. For instance, in one exemplary embodiment of the present invention the width of the dummy conductive vias 160a, 160b, are less than a width of the conductive via 150. As their width is less than the conductive via 150, the vacancies present in the first conductive feature 120 or conductive via 150 coalesce in the dummy conductive vias 160a, 160b, rather than the conductive via 150. Because the vacancies coalesce in the dummy conductive vias 160a, 160b, the stress migration voids are trapped in the dummy conductive vias 160a, 160b, rather than more critical portions of the circuitry, or in this instance the conductive via 150.

Depending on the proximity of the dummy conductive vias 160a, 160b, to the conductive via 150, their widths may vary. For instance, the closer the dummy conductive vias 160a, 160b, are to the conductive via 150 the less reduction in width is required for the dummy conductive vias 160a, 160b. As an example, the width of the dummy conductive vias 160a, 160b, may range from about 25% to about 98% of a width of the conductive via 150, or in an alternative embodiment range from about 50% to about 95% of the width of the conductive via 150. Similarly, the number of dummy conductive vias 160a, 160b, may also be reduced if the dummy conductive vias 160a, 160b, are located close to the conductive via 150. Additionally, the dummy conductive vias 160a, 160b, should be located less than about 10 times the width of the conductive via 150 from the conductive via 150, to function in their full capacity.

The dummy conductive vias 160a, 160b, illustrated in FIG. 1 are different from one another. As illustrated, the dummy conductive via 160a does not extend entirely through the dielectric layer 130. For this reason it can be positioned between the first and second conductive features 120, 140, without providing electrical connection between the two. On the other hand, the dummy conductive via 160b does extent entirely through the dielectric layer 130, much the same as the conductive via 150. However, as the dummy conductive via 160b is not located between the first and second conductive features 120, 140, it does not provide electrical connection there between. Each of the first and second conductive features 120, 140, might be used in different via architectures.

While not shown, the placement of the dummy conductive vias 160a, 160b, may take on a variety configurations. For instance, in an alternative embodiment of the invention one or both of the dummy conductive vias 160a, 160b, could be located proximate the conductive via 150 and contacting the conductive feature 120, however, extend down from the conductive feature 120 into the substrate 110. It is believed that this alternative configuration, as well as others, could also provide the desired vacancy trapping that is consistent with the principles of the present invention.

Formed over the second conductive feature 140 in the embodiment of FIG. 1 is a second dielectric layer 170. The second dielectric layer 170 may comprise any material that the dielectric layer 130 could have originally comprised. In many instances the dielectric layer 130 and the second dielectric layer 170 will comprise the same material. Nevertheless, this is not required. For example, in one embodiment of the invention the dielectric layer 130 comprises a low-k dielectric film while the second dielectric layer 170 comprises a standard undoped oxide film.

The use of the dummy conductive vias, when constructed according to the principles of the present invention, allow for the reduction of open circuits and changes in resistance caused by the migration of vacancies in the conductive features of the semiconductor device. This occurs because the conductive vias are substantially free of vacancies, the vacancies being trapped in the dummy conductive vias. Further, not only do the dummy conductive vias improve, if not eliminate, the open circuits caused by the migration of the vacancies, very few if any additional processing steps are required to implement them. Thus, the dummy conductive vias are very inexpensive to implement. Additionally, the dummy conductive vias may easily be positioned around areas of sensitive circuitry.

Figure 2:
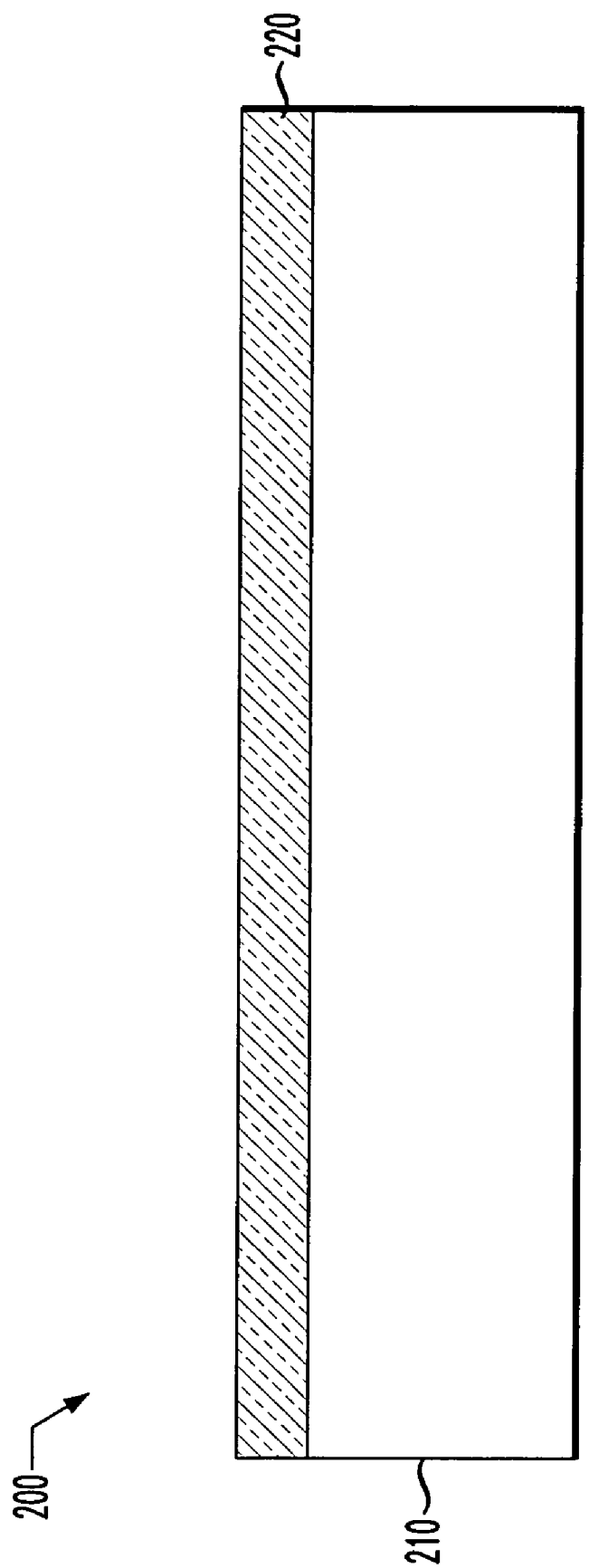
FIG. 2 illustrates a cross-sectional view of a partially completed semiconductor device manufactured in accordance with the principles of the present invention.

Turning now to FIGS. 2–7, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200 manufactured in accordance with the principles of the present invention. The partially completed semiconductor device 200 of FIG. 2 initially includes a substrate 210. The substrate 210 may, in an exemplary embodiment, be any layer located in the partially completed semiconductor device 200, including a wafer itself or a layer located above the wafer (e.g., dielectric layer). Similarly, the substrate 210 may comprise one or more layers while staying within the scope of the present invention.

Conventionally formed over the substrate 210 is a conductive feature 220. The conductive feature 220 in the embodiment shown in FIG. 2 operates as a conductive stripe or runner, thus electrically connecting various features on the substrate 210. While the conductive feature 220 may comprise any type of conductive material, the conductive feature 220 comprises copper in the embodiment shown.

The conductive feature 220 may be manufactured using a number of different well-known processes. In one embodiment the conductive feature 220 comprises a damascene structure, and therefore is manufactured using a damascene process. In this embodiment a traditional copper electroplating process could be used to manufacture the conductive feature 220. In an alternative embodiment, however, the conductive feature 220 could be deposited on the surface of the substrate 210, for example using a conventional sputter deposition process. Those skilled in the art nevertheless understand the processes that might be used to manufacture the conductive feature 220.

Figure 3:
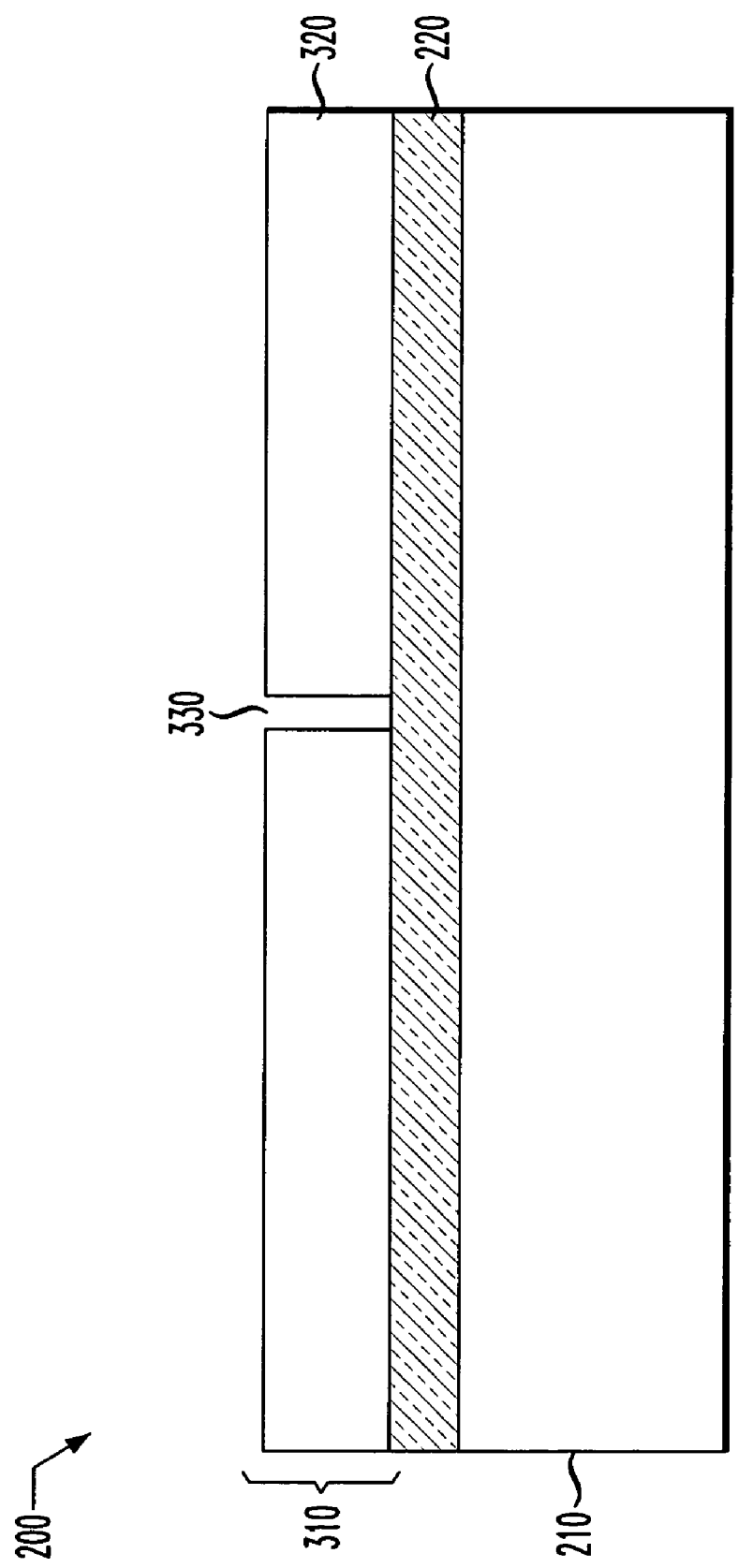
FIG. 3 illustrates a cross-sectional view of the partially completed semiconductor device illustrated in FIG. 2 after forming a first portion of a dielectric layer over the conductive feature, and thereafter forming a first dummy via opening in the first portion.

Turning now to FIG. 3, illustrated is a cross-sectional view of the partially completed semiconductor device 200 illustrated in FIG. 2 after forming a first portion 320 of a dielectric layer 310 over the conductive feature 220, and thereafter forming a first dummy via opening 330 in the first portion 320. The dielectric layer 310 may comprise any dielectric material known by those skilled in the art, such as silicon dioxide, a low dielectric constant material, or a non-silicon dielectric material. The use of insulating materials having a low dielectric constant are exemplary as they reduce the parasitic capacitance of the semiconductor device 200, thereby improving its operating speed.

In the illustrative embodiment of FIG. 3 the first portion 320 should have a thickness ranging from about 50% to about 80% of the total resulting thickness of the dielectric layer 310. Therefore, in the illustrated embodiment of FIG. 3 the thickness of the first portion 320 ranges from about 200 nm to about 320 nm. Other thicknesses, depending on the overall thickness of the dielectric layer 310, may also be used for the first portion 320.

Figure 7:
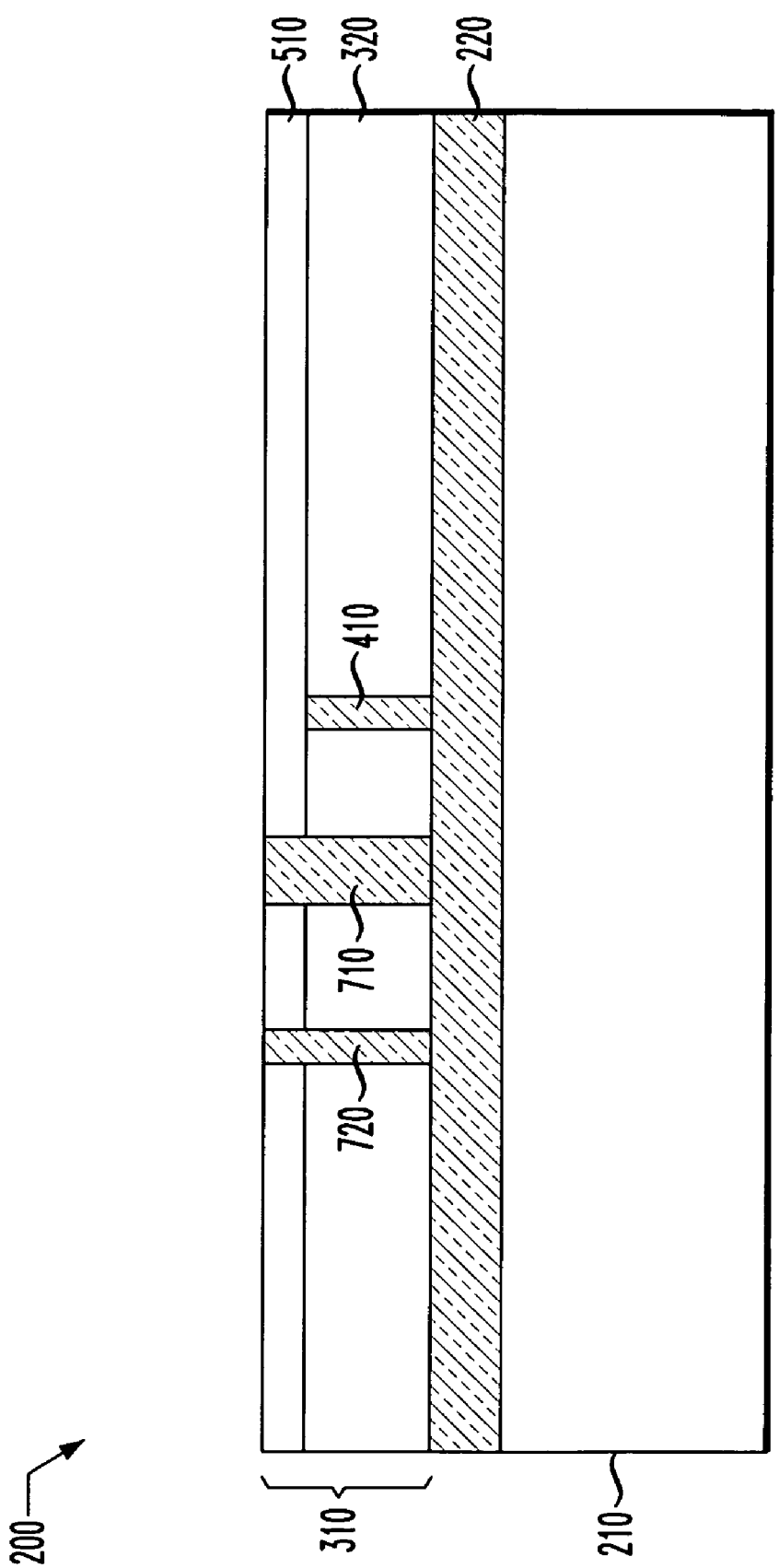
FIG. 7 illustrates a cross-sectional view of the partially completed semiconductor device illustrated in FIG. 6 after forming a conductive via and second dummy conductive via within the conductive via opening and second dummy via opening, respectively.

As is illustrated, formed within the first portion 320 is the first dummy via opening 330. The first dummy via opening 330 should advantageously have a width proportioned to a width of the conductive via 710 (FIG. 7). For instance, depending on the total number of dummy conductive vias and position of the dummy conductive vias with respect to the conductive via 710 (FIG. 7), the first dummy via opening 330 may have a width ranging from about 25% to about 98% of the conductive via 710 (FIG. 7) width, or in an exemplary embodiment from about 50% to about 95% of the conductive via 710 (FIG. 7) width. The closer the first dummy via opening 330 is to the conductive via 710 (FIG. 7) the less reduction in width is required. Similarly, the larger the number of dummy conductive vias, the less reduction in width is required for the first dummy via opening 330.

An exemplary lithographic process was used to form the first dummy via opening 330 in the first portion 320 of the dielectric layer 310. Lithography refers to a process for pattern transfer between various media. The lithographic process may include forming a radiation sensitive resist coating over the layer to be patterned, in this case the first portion 320 of the dielectric layer 310. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned resist layer. After the resist layer is patterned, the first portion 320 of the dielectric layer 310 may be etched using the patterned resist layer as a mask to transfer the pattern to the first portion 320 of the dielectric layer 310. Etch processes, among others, might include plasma etching, reactive ion etching, wet etching, or combinations thereof.

Figure 4:
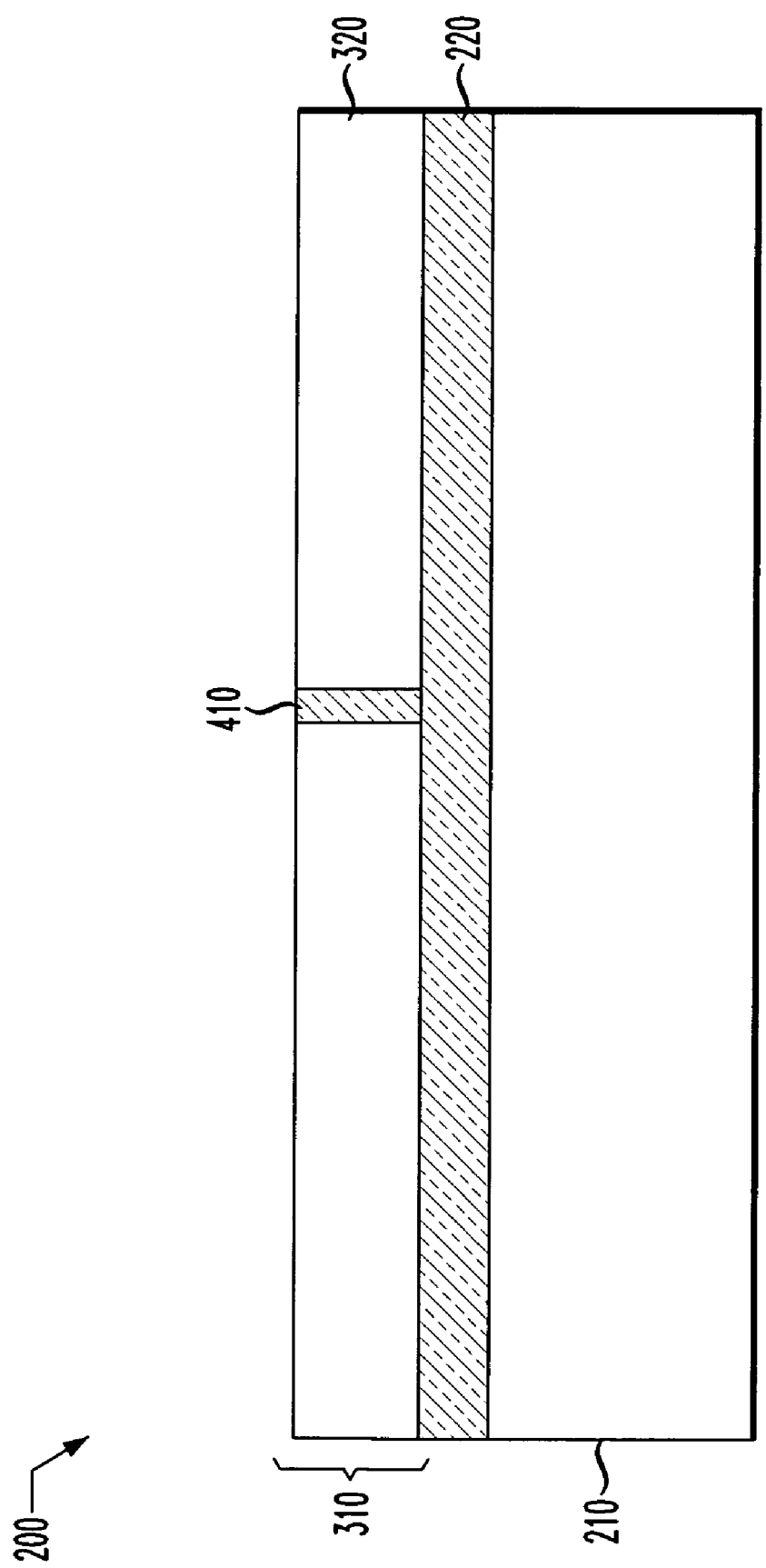
FIG. 4 illustrates a cross-sectional view of the partially completed semiconductor device illustrated in FIG. 3 after forming a first dummy conductive via within the first dummy via opening.

Turning now to FIG. 4, illustrated is a cross-sectional view of the partially completed semiconductor device 200 illustrated in FIG. 3 after forming a first dummy conductive via 410 within the first dummy via opening 330. In the particular embodiment of FIG. 4, the first dummy conductive via 410 comprises copper and contacts the first conductive feature 220.

The first dummy conductive via 410 may be formed using a number of different processes. Most likely, however, the first dummy conductive via 410 is formed using a conventional copper electroplating process. In this embodiment, a thin copper seed layer would be deposited on the exposed surfaces of the first portion 320 of the dielectric layer 310, including the sidewalls and bottom surface of the first dummy via opening 330. The entire device, including the copper seed layer, would then be exposed to a copper electroplating solution, resulting in a blanket copper layer. As the blanket copper layer would most likely also form on the top of the first portion 320, a chemical mechanical polishing (CMP) process would be required to remove the excess blanket copper layer. The resulting structure would resemble the first dummy conductive via 410. Other manufacturing processes, outside of the aforementioned copper electroplating process, could nonetheless be used to form the first dummy conductive via 410.

Figure 5:
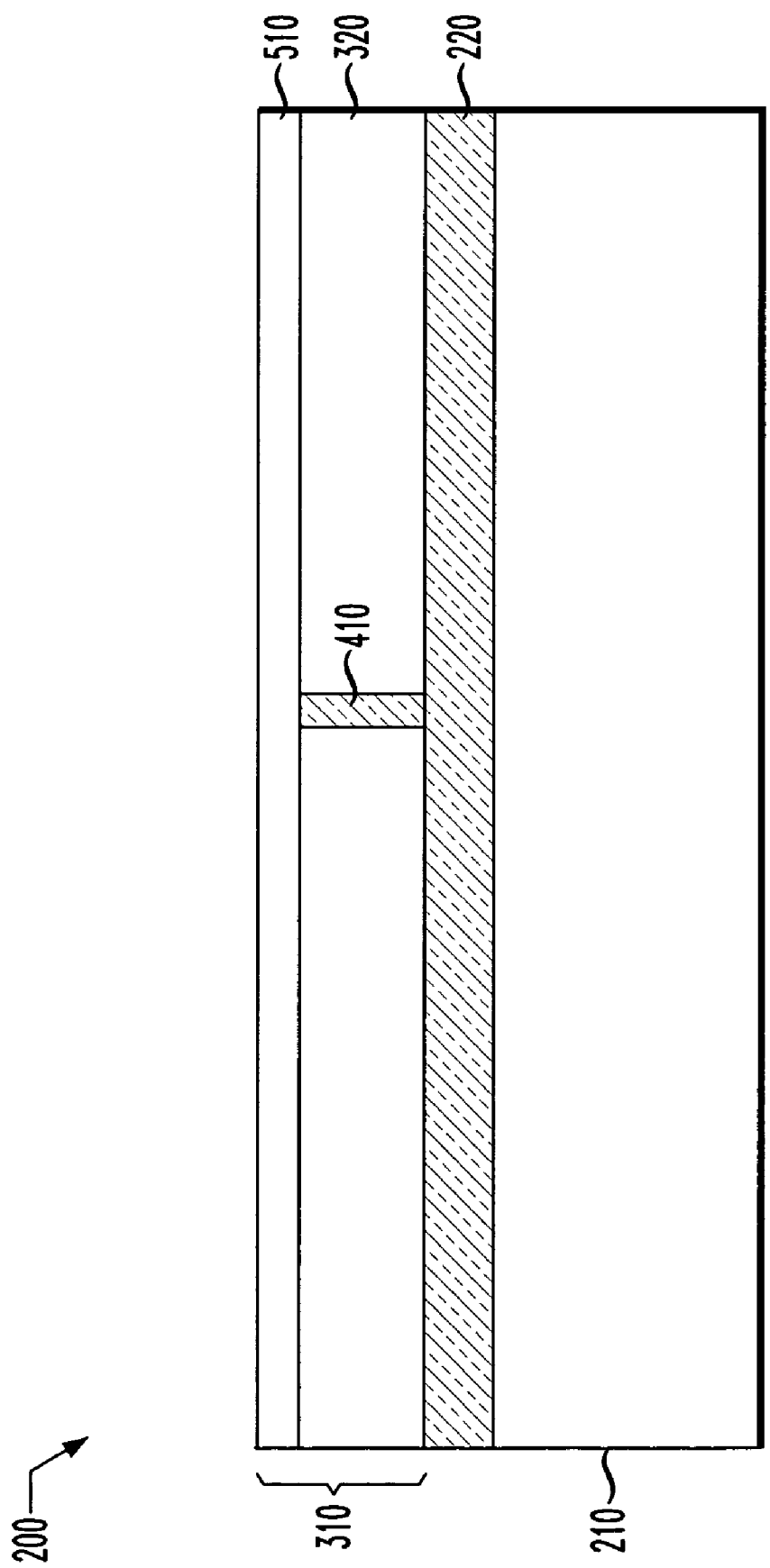
FIG. 5 illustrates a cross-sectional view of the partially completed semiconductor device illustrated in FIG. 4 after forming a second portion of the dielectric layer.

Turning briefly to FIG. 5 illustrated is a cross-sectional view of the partially completed semiconductor device 200 illustrated in FIG. 4 after forming a second portion 510 of the dielectric layer 310. The second portion 510, similar to the first portion 320, may be any dielectric material known by those skilled in the art, such as silicon dioxide, a low dielectric constant material, or a non-silicon dielectric material. In the illustrative embodiment of FIG. 5 the second portion 510 should have a thickness ranging from about 20% to about 50% of the total resulting thickness of the dielectric layer 310. Therefore, in the illustrated embodiment of FIG. 5 the thickness of the second portion 510 ranges from about 80 nm to about 200 nm. Other thicknesses, depending on the overall thickness of the dielectric layer 310, may also be used for the second portion 510.

Figure 6:
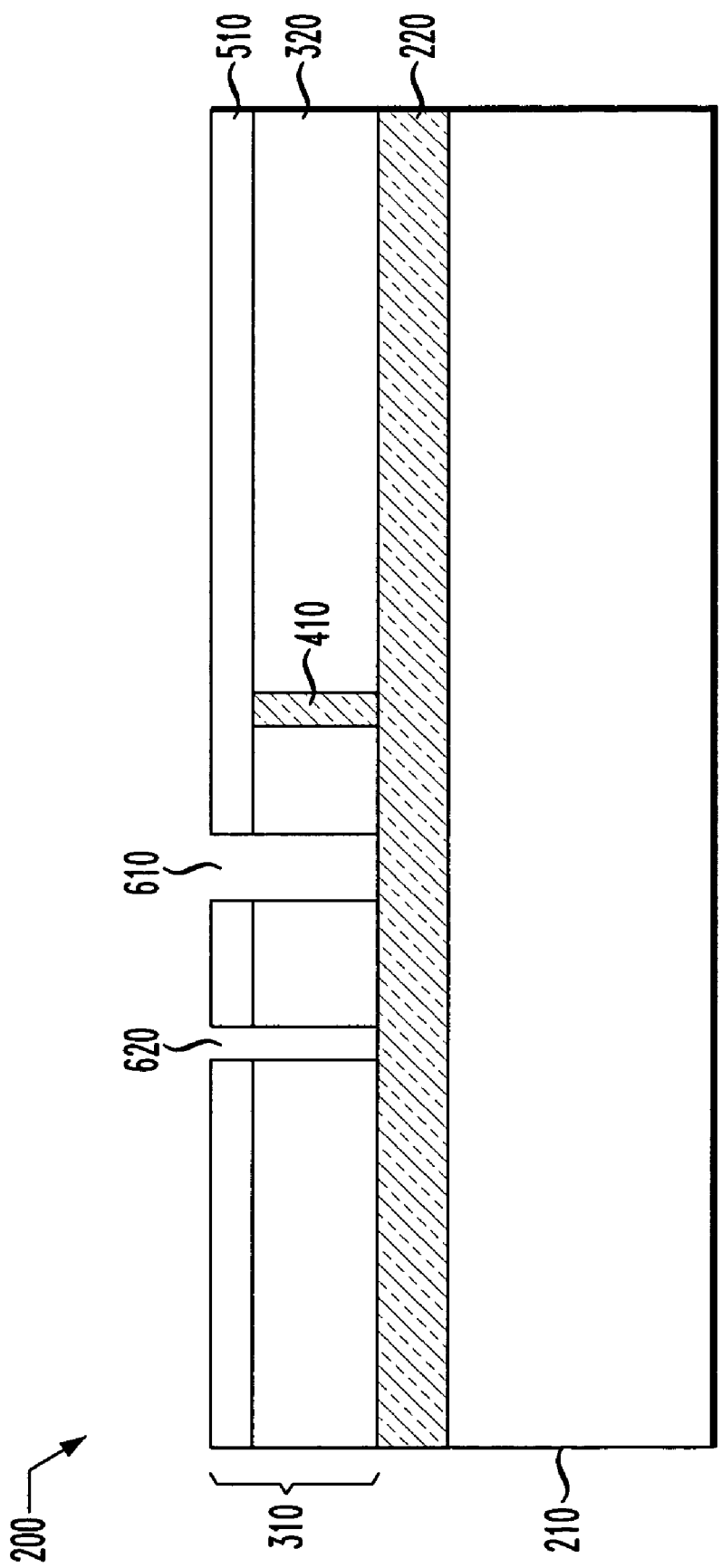
FIG. 6 illustrates a cross-sectional view of the partially completed semiconductor device illustrated in FIG. 5 after forming a conductive via opening and a second dummy via opening in the dielectric layer.

Turning to FIG. 6 illustrated is a cross-sectional view of the partially completed semiconductor device 200 illustrated in FIG. 5 after forming a conductive via opening 610 and a second dummy via opening 620 in the dielectric layer 310. In the particular embodiment of FIG. 6, the conductive via opening 610 and the second dummy via opening 620 extend entirely through the first and second portions 320, 510 of the dielectric layer 310.

While the width of the conductive via opening 610 is based on the predetermined design rules of the semiconductor device 200, the width of the second dummy via opening 620 is based on the width of the conductive via 710 (FIG. 7). For instance, depending on the total number of dummy conductive vias and position of the dummy conductive vias with respect to the conductive via 710 (FIG. 7), the second dummy via opening 620 may have a width ranging from about 25% to about 98% of the conductive via 710 (FIG. 7) width, or in an exemplary embodiment from about 50% to about 95% of the conductive via 710 (FIG. 7) width. The closer the second dummy via opening 620 is to the conductive via 710 (FIG. 7) the less reduction in width is required. Similarly, the larger the number of dummy conductive vias, the less reduction in width is required for the second dummy via opening 620. As both the first dummy via opening 330 and the second dummy via opening 620 widths are based on the same factors, in certain embodiments of the invention the first dummy via opening 330 and the second dummy via opening 620 have substantially similar widths.

In the illustrative embodiment shown in FIG. 6, the second dummy via opening 620, as well as the first dummy via opening 330, are located within about 10 times the width of the conductive via opening 610 from the conductive via opening 610. Actually, the first and second dummy via openings 330, 620, are advantageously located within about 5 times the width of the conductive via opening 610 from the conductive via opening 610. It goes without saying that the conductive via opening 610 and the second dummy via opening 620 may both be formed using the same technique as used to form the first dummy via opening 330.

Turning now to FIG. 7, illustrated is a cross-sectional view of the partially completed semiconductor device 200 illustrated in FIG. 6 after forming a conductive via 710 and second dummy conductive via 720 within the conductive via opening 610 and second dummy via opening 620, respectively. As the conductive via 710 and second dummy conductive via 720 are formed using similar processing steps as that used to form the first dummy conductive via 410, further detail will not be given. After completing the conductive via 710 and second dummy conductive via 720, the manufacturing process would continue in a conventional manner, resulting in a device similar to the semiconductor device 100 illustrated in FIG. 1.

Figure 8:
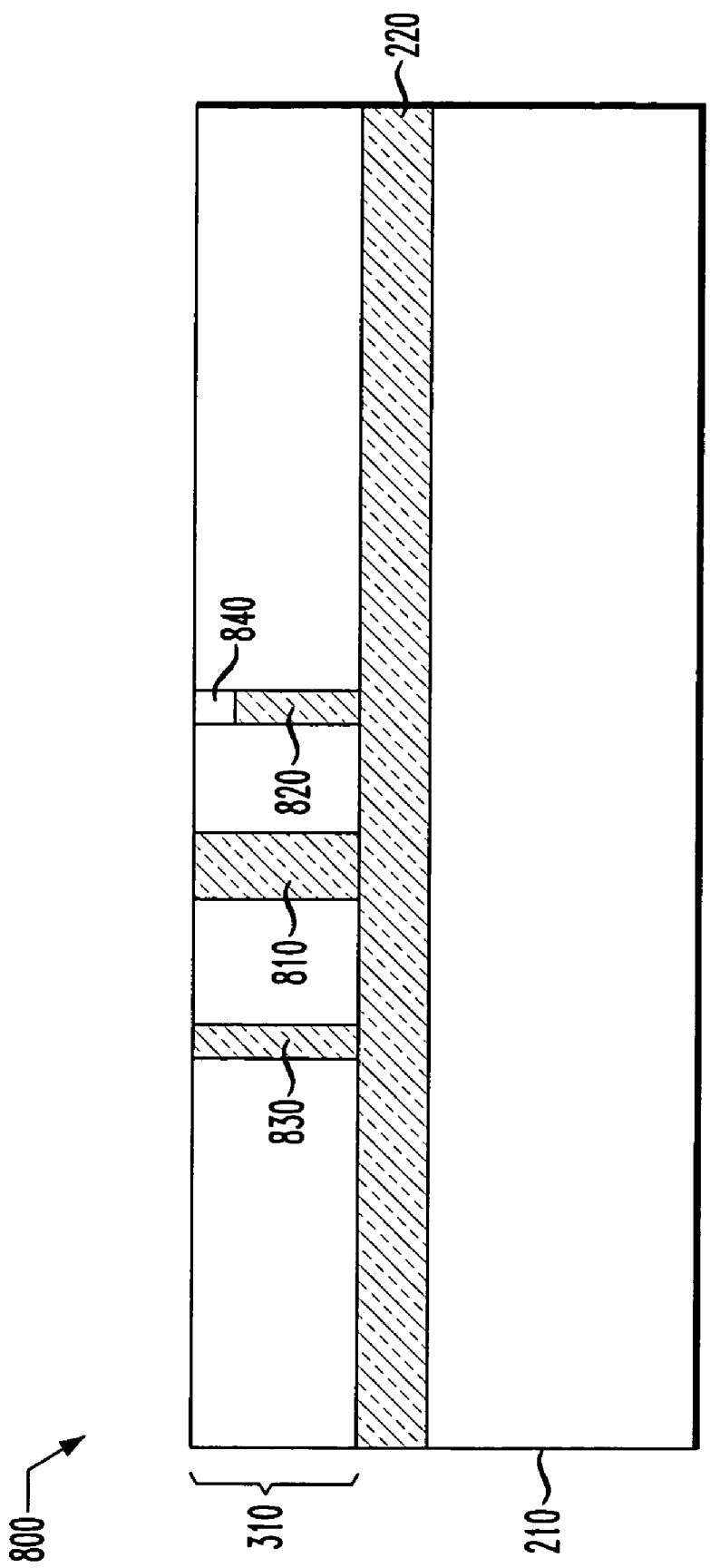
FIG. 8 illustrates a cross-sectional view of an alternative embodiment of a partially completed semiconductor device constructed in accordance with the principles of the present invention.

Those skilled in the art understand that the method for manufacturing a semiconductor device in accordance with the principles of the present invention need not always follow the process flow illustrated in FIGS. 2–7. For instance, another embodiment exists wherein the conductive via opening, first dummy via opening and second dummy via opening are all simultaneously formed within a dielectric layer. In this embodiment the dielectric layer need only comprise a single layer, and not the first and second portions as discussed above. After filling the conductive via opening, first dummy via opening and second dummy via opening with the conductive metal, a conductive via 810, first dummy conductive via 820 and second dummy conductive via 830, each having the same height, results. Thereafter, a portion of the top of the first dummy conductive via 820 could be removed and replaced with a dielectric plug 840. What would result is a partially completed semiconductor device similar to the partially completed semiconductor device 800 illustrated in FIG. 8. Nevertheless, other process flows are within the scope of the present invention.

Figure 9:
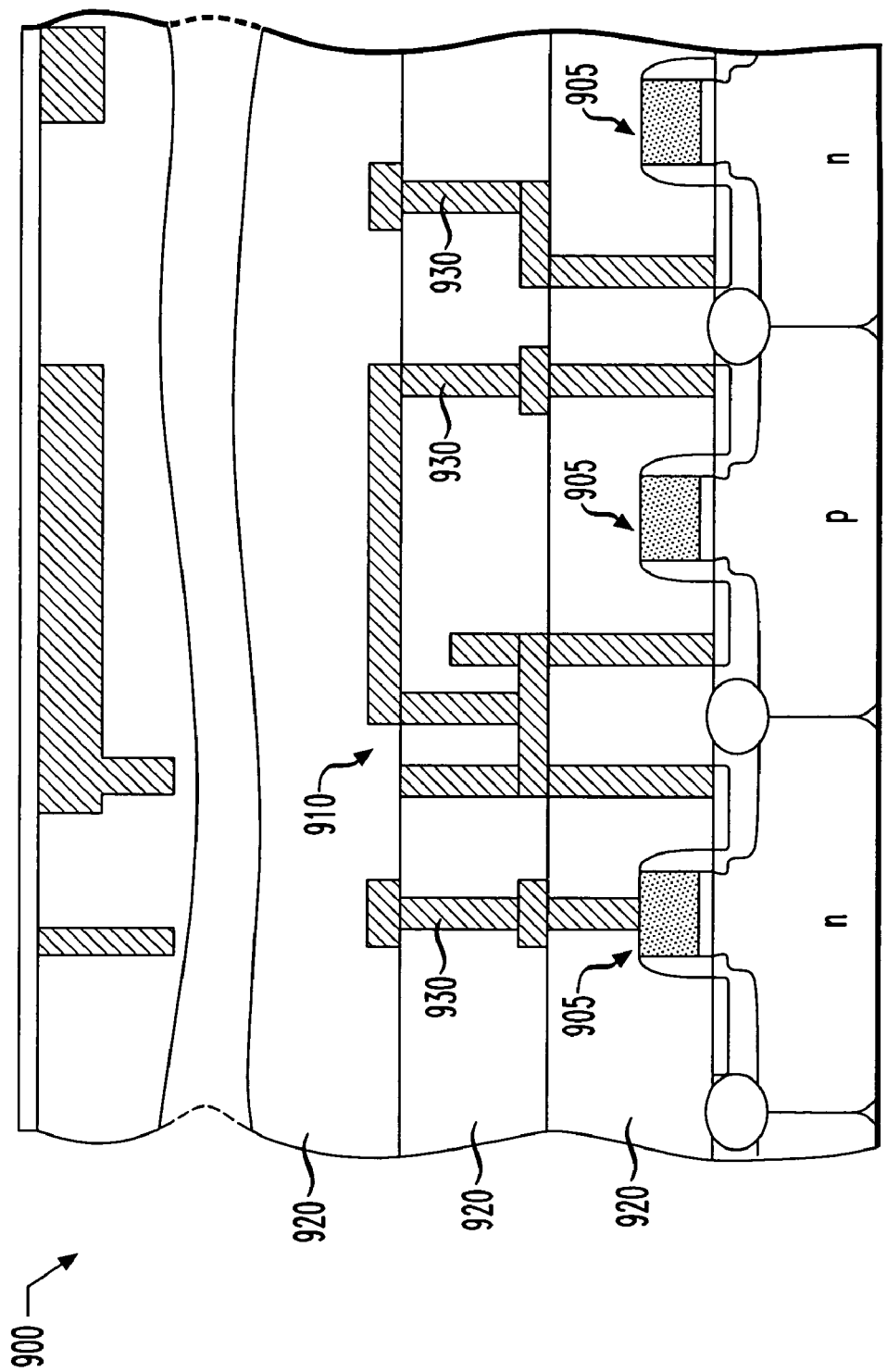
FIG. 9 illustrates an exemplary cross-sectional view of an integrated circuit (IC) incorporating a semiconductor device constructed according to the principles of the present invention.

Referring finally to FIG. 9, illustrated is an exemplary cross-sectional view of an integrated circuit (IC) 900 incorporating a semiconductor device 910 constructed according to the principles of the present invention. The IC 900 may include devices, such as transistors used to form CMOS devices, BiCMOS devices, Bipolar devices, as well as capacitors or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes transistor devices 905 located below the semiconductor device 910. As is illustrated in FIG. 9, dielectric layers 920 may be located between and over the semiconductor device 910 and transistor devices 905. Additionally, interconnect structures 930 may be located within the dielectric layers 920 to interconnect various devices, thus, forming the operational integrated circuit 900.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:

placing a dielectric layer over a conductive feature;

creating a conductive via within the dielectric layer and contacting the conductive feature; and forming a dummy conductive via contacting the conductive feature, wherein the dummy conductive via is proximate the conductive via and has a width smaller than a width of the conductive via.

2. The method as recited in claim 1 wherein forming a dummy conductive via includes forming a dummy conductive via having a width ranging from about 25% about 98% of a width of the conductive via.

3. The method as recited in claim 1 wherein forming a dummy conductive via includes forming a dummy conductive via less than about 10 times a width of the conductive via from the conductive via.

4. The method as recited in claim 1 wherein the conductive feature is a first conductive feature and further including placing a second conductive feature over the dielectric layer, wherein the conductive via extends through the dielectric layer electrically connecting the first and second conductive features, wherein the dummy conductive via extends through the dielectric layer but does not electrically connect the first conductive feature to another conductive feature.

5. The method as recited in claim 1 wherein forming a dummy conductive via includes forming a first dummy conductive via and further including forming a second dummy conductive via within the dielectric layer contacting the conductive feature, wherein the second dummy conductive via is located proximate the conductive via and is configured to trap vacancies associated with the conductive feature or the conductive via.

6. The method as recited in claim 1 wherein the conductive via is substantially void of vacancies and the dummy conductive via is not substantially void of vacancies.

7. The method as recited in claim 1 wherein forming a dummy conductive via includes forming a dummy conductive via having a width ranging from about 50% to about 95% of a width of the conductive via.

8. The method as recited in claim 1 wherein the dummy conductive via is located within the dielectric layer.

9. The method as recited in claim 8 wherein the conductive via extends entirely through the dielectric layer and the dummy conductive via does not extend entirely through the dielectric layer.

* * * * *